(12) United States Patent
Kazama

(10) Patent No.: US 7,404,717 B2
(45) Date of Patent: Jul. 29, 2008

(54) CONTACTOR

(75) Inventor: Toshio Kazama, Nagano (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 0 days.

(21) Appl. No.: 10/483,608

(22) PCT Filed: Jul. 12, 2002

(86) PCT No.: PCT/JP02/07115

§ 371 (c)(1),
(2), (4) Date: Jan. 12, 2004

(87) PCT Pub. No.: WO03/007435

PCT Pub. Date: Jan. 23, 2003

(65) Prior Publication Data

US 2004/0175979 A1  Sep. 9, 2004

(30) Foreign Application Priority Data

Jul. 13, 2001 (JP) .............................. 2001-214249

(51) Int. Cl.
*H01R 12/00* (2006.01)
(52) U.S. Cl. ...................................................... 439/66
(58) Field of Classification Search ............ 439/68–73, 439/66, 525, 331, 591, 91, 263, 862, 330, 439/526, 912

See application file for complete search history.

(56) References Cited

U.S. PATENT DOCUMENTS

| 5,518,410 | A | * | 5/1996 | Masami | ..................... 439/71 |
| 5,727,954 | A | * | 3/1998 | Kato et al. | ..................... 439/66 |
| 5,791,914 | A | * | 8/1998 | Loranger et al. | ............. 439/71 |
| 5,807,104 | A | * | 9/1998 | Ikeya et al. | ................... 439/73 |
| 6,043,666 | A | * | 3/2000 | Kazama | ..................... 324/754 |
| 6,190,181 | B1 | * | 2/2001 | Affolter et al. | ................ 439/70 |
| 6,213,787 | B1 | * | 4/2001 | Murphy | ..................... 439/71 |
| 6,491,527 | B1 | * | 12/2002 | Smith | ......................... 439/66 |

FOREIGN PATENT DOCUMENTS

| JP | 08-213088 | 8/1996 |
| JP | 09-121007 | 5/1997 |
| JP | 10-144439 | 5/1998 |
| JP | 10-214649 | 8/1998 |
| JP | 11-087004 | 3/1999 |
| JP | 2000-150095 | 5/2000 |
| JP | 2000-329790 | 11/2000 |
| JP | 2001-057263 | 2/2001 |
| JP | 2001-167831 | 6/2001 |
| JP | 2001-249163 | 9/2001 |
| JP | 2002-270320 | 9/2002 |
| WO | 00/03251 | 1/2000 |

* cited by examiner

*Primary Examiner*—Edwin A. León
(74) *Attorney, Agent, or Firm*—Nath Law Group; Jerald L. Meyer; Sung Yeop Chung

(57) ABSTRACT

A uniform contact resistance is obtained by a contact spring (2) having a leg portion (2b), a body portion (2c) and a tightly twisted neck portion (2a); a holder (6) having a reception hole (7) from which the leg portion (2b) and the neck portion (2a) are allowed to project and the body portion (2c) is inhibited from coming out; a float type guide plate (5) having a guide hole (3) into which the neck portion (2a) is inserted, and a support spring (15) interposed between the holder and the guide plate.

12 Claims, 4 Drawing Sheets

$L_t = L_5$ $L_t = L_5 + L_p$ $L_t = L_5 + L_p + L_a$ $L_{2t} = 0$
$L_{15t} = L_5 + L_p$ $L_{2t} = L_a \cdot k$
$L_{15t} = L_5 + L_p + L_a(1-k)$

CONTACTOR

TECHNICAL FIELD

The present invention relates to a conductive contactor (referred to herein simply as a "contactor"), which is provided with contact springs for electrical connection between electric contacts of a semiconductor package and conductor members of a wiring plate.

BACKGROUND ART

FIG. 1 to FIG. 3B are schematic diagrams showing a prior art vertical contactor 100. FIG. 1 is a plan view of the contactor 100; FIG. 2 a cross sectional view showing the characterized structure of the contactor 100; FIG. 3A a cross sectional view showing the contactor 100 interposed between a semiconductor package P and a wiring plate 4 for the powered test of the package P; FIG. 3B a cross sectional view showing the contactor 100 to which an external pressure is applied to obtain a contact resistance required for the powered test.

The contactor 100 includes a multitude (several tens to several thousands) of contact springs 2 which are arranged in a matrix as shown in FIG. 1 and each of which is vertically oriented as shown in FIG. 2, a holder 6a for supporting the lower portions of these springs 2 and positioning them relative to the conductor members 4a of the wiring plate 4, and a floating guide plate 5 (referred to herein as a "guide plate") for accepting and guiding the upper portions of the springs 2 and centering them relative to the contacts P2 of the back surface of the substrate P1 of the semiconductor package P.

As shown in FIG. 2, each of the contact springs 2 includes a long body portion 2c having a relatively large diameter, a neck portion 2a having a relatively small diameter and upwardly extending from the upper end of this body portion 2c, and a leg portion 2b downwardly extending from the lower end of the body portion 2c and tapered with a decreasing diameter to form a shoulder portion 2d from the body portion 2c to the neck portion 2a with a decreasing diameter and a seat portion 2e from the body portion 2c to the leg portion 2b with a decreasing diameter. The contact spring 2 is composed of a single conductive steel wire as twisted to have a "helical pitch larger than the diameter of the steel wire" in the intermediate portion of the body portion 2c (referred to herein as a "pitch helix") except the upper and lower ends thereof in a normal condition (i.e., with no load), and a "helical pitch substantially equal to the diameter of the steel wire" in the rest (i.e., in the neck portion 2a, the upper and lower ends of the body portion 2c and the leg portion 2b which are referred to herein as a "tight helix"). In the tight helix, adjacent turns are contacting each other without a clearance to form a cylindrical conductor.

As shown in FIG. 2, the holder 6 includes an upper surface 6a and a bottom surface 6b in parallel with each other, and is formed with lower spring support holes 7 which are opened in the upper surface 6a and downwardly extending with a larger diameter than the spring body portion 2c and through holes 7d which are opened in the lower surface 6b with a smaller diameter than the spring body portion 2c and communicating with the lower spring support holes 7 to form steps 11 tapered with a decreasing diameter from the support hole 7 to the through holes 7d.

When the contact spring 2 is inserted into the lower spring support hole 7, the spring 2 is stopped with the seat portion 2e being seated against the step 11 and supported in an upright attitude by the spring support hole 7 to project an upper half of the spring 2 from the holder upper surface 6a and the lower end of the leg portion 2b from the holder lower surface 6b.

As shown in FIG. 2, the guide plate 5 also includes an upper surface 5a and a bottom surface 5b in parallel with each other, and is formed with upper spring support holes 9 which are opened in the lower surface 5b and upwardly extending with a larger diameter than the spring body portion 2c and guide holes 3 which are opened in the upper surface 5a with a smaller diameter than the spring body portion 2c, downwardly extending and communicating with the lower spring support holes 7 to form steps 8 tapered with a decreasing diameter from the support holes 9 to the guide holes 3.

This guide plate 5 has a rectangular profile as shown in FIG. 1.

When the upper half portions of the springs 2 projected from the holder upper surface 6a are engaged with the support hole 9 of the guide plate 5 followed by releasing the guide plate 5, the neck portions 2a are guided from the support hole 9 to the guide hole 3 and the steps 8 are seated against the shoulder portion 2d with the guide plate 5 moving downward. The guide plate 5 is then stopped with the springs 2 being compressed by a dimension corresponding to the own weight load L5 of the guide plate 5 per spring to obtain the distance d between the holder 6 and the plate 5 optimal for powered test. At this time, while the neck portion 2a of the spring 2 is located lower than the plate upper surface 5a, the upper end thereof is located in the upper half portion of the guide hole 3. If the total load applied to each spring 2 is Lt, Lt=L5 in the normal condition of the contactor 100 (FIG. 2).

The contactor 100 is provided for powered test in an assembled condition in which the wiring plate 4 is attached to the holder bottom surface (the condition as illustrated in FIG. 3A from which the package P is removed).

In this condition, the lower end of the leg portion 2b of the contact spring 2 is in line contact with the upper surface of the conductor member 4a flush with the upper surface of the wiring plate 4 closely contacting the holder bottom surface 6b to lift the seat portion 2e of the spring 2 from the step 11 of the holder 6 and lift the guide plate 5 increasing the distance d from the holder 6.

The powered test of the semiconductor package P is initiated by setting the package P on the assembly as illustrated in FIG. 3A. Namely, an electric contact P2 such as a hemispheric contact projected from the back surface of the substrate P1 of the package P is engaged with a guide hole 3 of the guide plate 5, and the back surface of the substrate P1 is seated against the plate upper surface 5a The neck portion 2 is centered in relation to the contact P2 by abutting the contact P2 against the upper end of the cylindrical and flexible neck portion 2a with its upper inner surface being in line contacts with the contact P2.

In this setting condition, the package load Lp per spring is exerted on each springs 2 which is thereby compressed to decrease the distance between the holder 6 and the guide plate 5 to $d_0$. The total load Lt applied to each spring 2 is then Lt=L5+Lp.

In this case, since the guide plate 5 is supported by its steps 8 on the shoulder portions 2d of the springs 2, the depth of insertion of the neck portion 2a into the guide hole 3 is constant for each spring, and the degree of contact between the neck portion 2a and the corresponding contact P2 depends on the depth of insertion of the contact P2 into the guide hole 3. Because of this, the contact resistance between the neck portion 2a and the contact P2 slightly varies and becomes inequable in accordance with the location of the respective contact springs 2 as shown in FIG. 1 depending upon the ununiform surface contact between the back surface of the substrate P1 and the upper surface 5a of the guide plate 5 and the dispersion in manufacturing factors of the contact P2.

As shown in FIG. 3B, the powered test of the package P is conducted after uniformly contacting the back surface of the substrate P1 with the upper surface 5a of the guide plate 5 and uniformly applying an external force to the guide plate 5 in order to make the load on each spring equal to a predetermined value La At this time, the spring 2 is compressed in correspondence with the external force to decrease the distance between the holder 6 and the guide plate 5. The total load Lt applied to each spring 2 is then Lt=L5+Lp+La.

DISCLOSURE OF INVENTION

The inventor of the invention noticed the following points in the efforts of making uniform the contact resistance.

(1) The holder 6 and the guide plate 5 are indispensable for aligning a multitude of the contact springs 2 with the contacts P2 with high accuracy.

(2) Since the accuracy of the profile of the guide plate 5 differs from the accuracy of the positions of the contacts P2, the guide plate 5 is preferably of a float type rather than fixed to the holder 6 or the package substrate P1.

(3) It becomes easy to bring the back surface of the substrate P1 into uniform contact with the upper surface 5a of the guide plate 5 by increasing the thickness of the holder 6 supporting a multitude of the contact springs 2 to increase the rigidity of the holder 6, and on the other hand by decreasing the thickness of the float type guide plate 5 to decrease the rigidity thereof.

(4) However, when decreasing the rigidity of the guide plate 5 receiving the resilient forces of the multitude of the contact springs 2, the guide plate 5 is increasingly distorted while experiencing a stress corresponding to the local sum of the vectors of the resilient forces and the total sum of the vectors and it is difficult to bring the back surface of the substrate P1 into uniform contact with the upper surface 5a of the guide plate 5.

(5) In the case of the structure where the guide plate 5 is supported by its steps 8 on the shoulder portions 2d of the springs 2, even with uniform contact between the back surface of the substrate P1 and the upper surface 5a of the guide plate 5, the degree of contact between the neck portion 2a and the corresponding contact P2 depends on the depth of insertion of the contact P2 into the guide hole 3, and a uniform contact resistance can not be obtained if the manufacturing factors such as the projection length of the contacts P2 are dispersed.

(6) The contact springs 2 has both a supporting funtion (Lt+Lp) and a resilient contact funtion (reactive force against La). For this reason, there is little flexibility in selecting the rate of spring.

(7) If the guide plate 5 is supported only by the contact springs 2, the external pressure La might excessively increase or decrease depending upon the variation of the resilient forces or the number of the springs to decrease the endurance or to lower the accuracy of test (8) If the guide plate 5 warps under the loads of the contact springs 2, the decrease in the endurance and the accuracy of test due to loose connection of the solder balls contacts P2 occurs.

The invention has been made in the circumstances (1) to (8), particularly (5) and (6) as described above. It is an object to provide a contactor with a uniform contact resistance.

It is another object of the invention to provide a contactor with which an stable operation is possible regardless of the number of contact springs and a guide plate is prevented from warping with an sufficient endurance and a stable conductivity.

It is a further object of the invention to increase flexibility of determining the rate of spring.

The invention as recited in claim 1 solving the above objects is a contactor characterized by a contact spring having a leg portion, a body portion and a tightly twisted neck portion; a holder having a reception hole from which the leg portion and the neck portion are allowed to project out and the body portion is inhibited from coming out; a float type guide plate having a guide hole into which the neck portion is inserted; and a support spring interposed between the holder and the guide plate.

In accordance with the invention as recited in claim 1, since the neck portion of the contact spring can be inserted into the guide plate to a desired depth, it is possible to obtain a uniform contact resistance even with manufacturing dispersion of the contact of the semiconductor package. Also, since the guide plate is supported by the support springs, it is possible to increase flexibility of determining the rate of spring.

The invention as recited in claim 2 is a contactor comprising a guide hole for receiving a contact of the substrate of a semiconductor package, and a contact spring assembled with its neck portion located to come in contact with the contact inserted into the guide hole and its leg portion to be electrically connected to a conductor member of a wiring plate. The contactor is characterized in that the guide hole is opened with a diameter, allowing the neck portion to be inserted thereinto, through a guide plate which is arranged in order to move close to and apart from a holder retractably accommodating the contact spring, and the neck portion is tightly twisted, projecting out from the holder and slidably inserted into the guide hole, wherein the guide plate is urged by a support spring in the backward direction relative to the holder.

Because of this, in accordance with the invention as recited in claim 2, since the contact spring is retractably inserted in the holder with its neck portion projecting out from the holder and slidably inserted into the guide hole of the guide plate, the guide plate is assembled free from the load of the contact spring.

Also, since the guide hole has a diameter to allow the neck portion of the contact spring to be inserted thereinto, a contact of the substrate even with an outer diameter larger than the neck portion also can be positioned and inserted thereinto.

Furthermore, since a support spring for supporting the guide plate 5 is provided separate from the contact spring, the force of pushing up the guide plate can be adjusted without compromising the electrical characteristics by suitably selecting the resilient force of the support spring.

Still further, the distance between the guide plate and the holder can be arbitrarily determined by suitably selecting the length of the support spring and the winding number of the neck portion of the contact spring without any modification of the thickness of the guide plate 5 and the electrical characteristics of the contact, and it is possible to set the upper surface of the guide plate at a height which is selected to decrease the drop of the semiconductor package P during the test.

The invention as recited in claim 3 is a contactor characterized in that the contact spring is plated with a metal lacking affinity for solder.

Because of this, in accordance with claim 3, it is possible to prevent the contact and the neck portion of the semiconductor package from welding together during test.

BEST MODE FOR CARRYING OUT THE INVENTION

In the following explanation, an embodiment of this invention will be explained with reference to FIGS. 4, 5, 6A and 6B. Like numerals indicate like elements as shown in FIGS. 1, 2, 3A and 3B to omit redundant explanation, and different structures will be explained.

Figure 1:
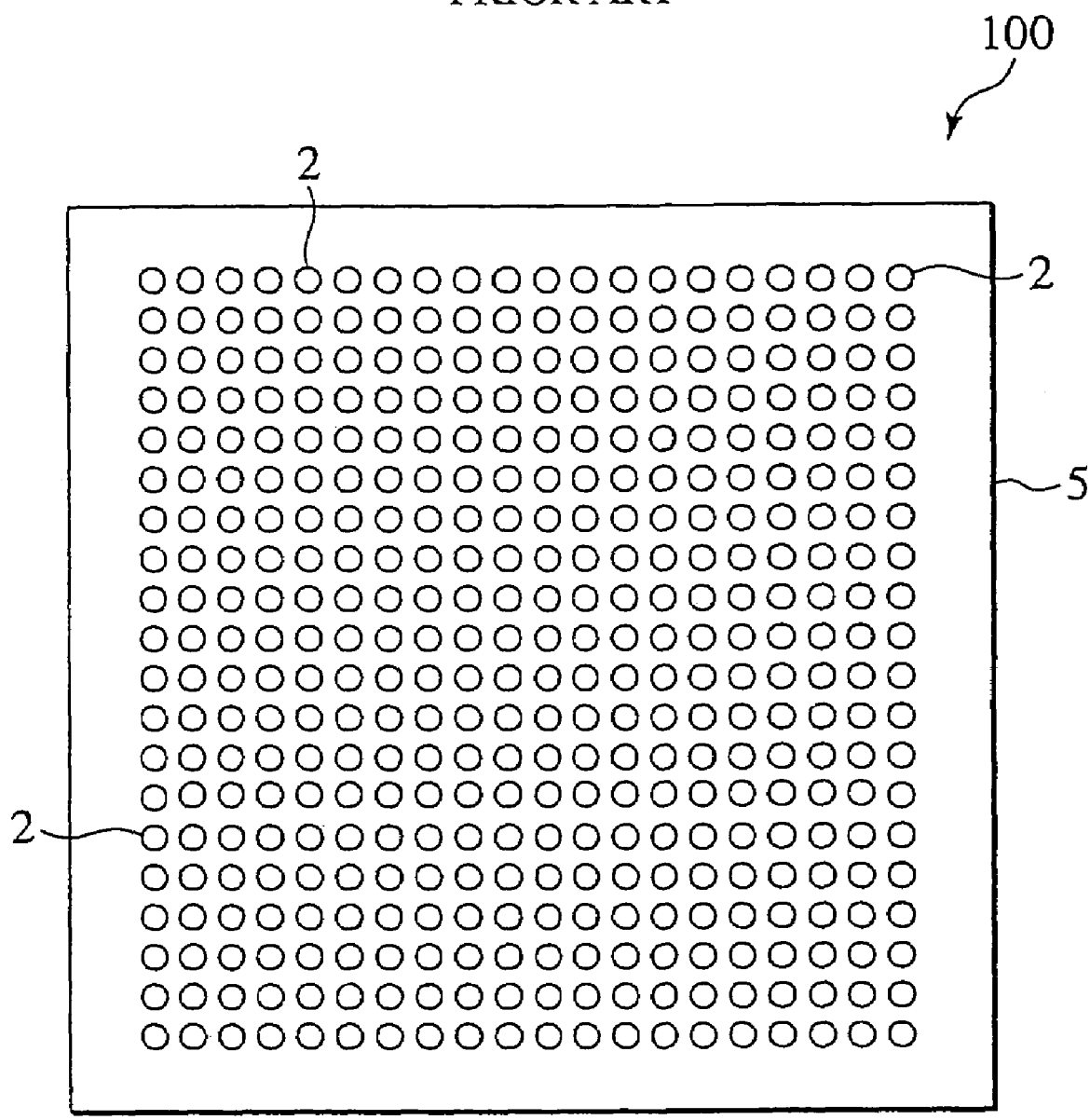
FIG. 1 is a plan view showing a prior art contactor.
Figure 2:
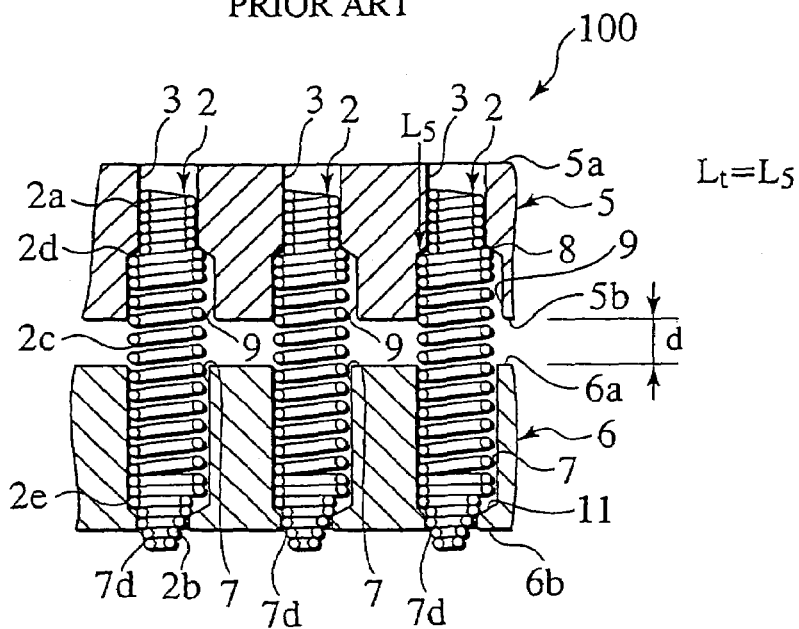
FIG. 2 is a cross sectional view showing the characterized structure thereof.
Figure 3A:
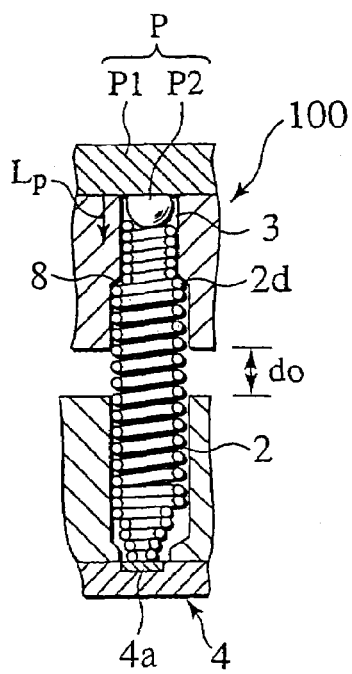
FIG. 3A is a cross sectional view showing a semiconductor package coupled with the characterized structure.
Figure 3B:
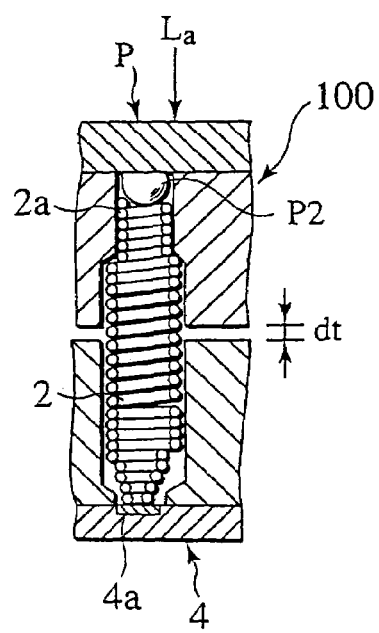
FIG. 3B is a cross sectional view showing the characterized structure during powered test.
Figure 4:
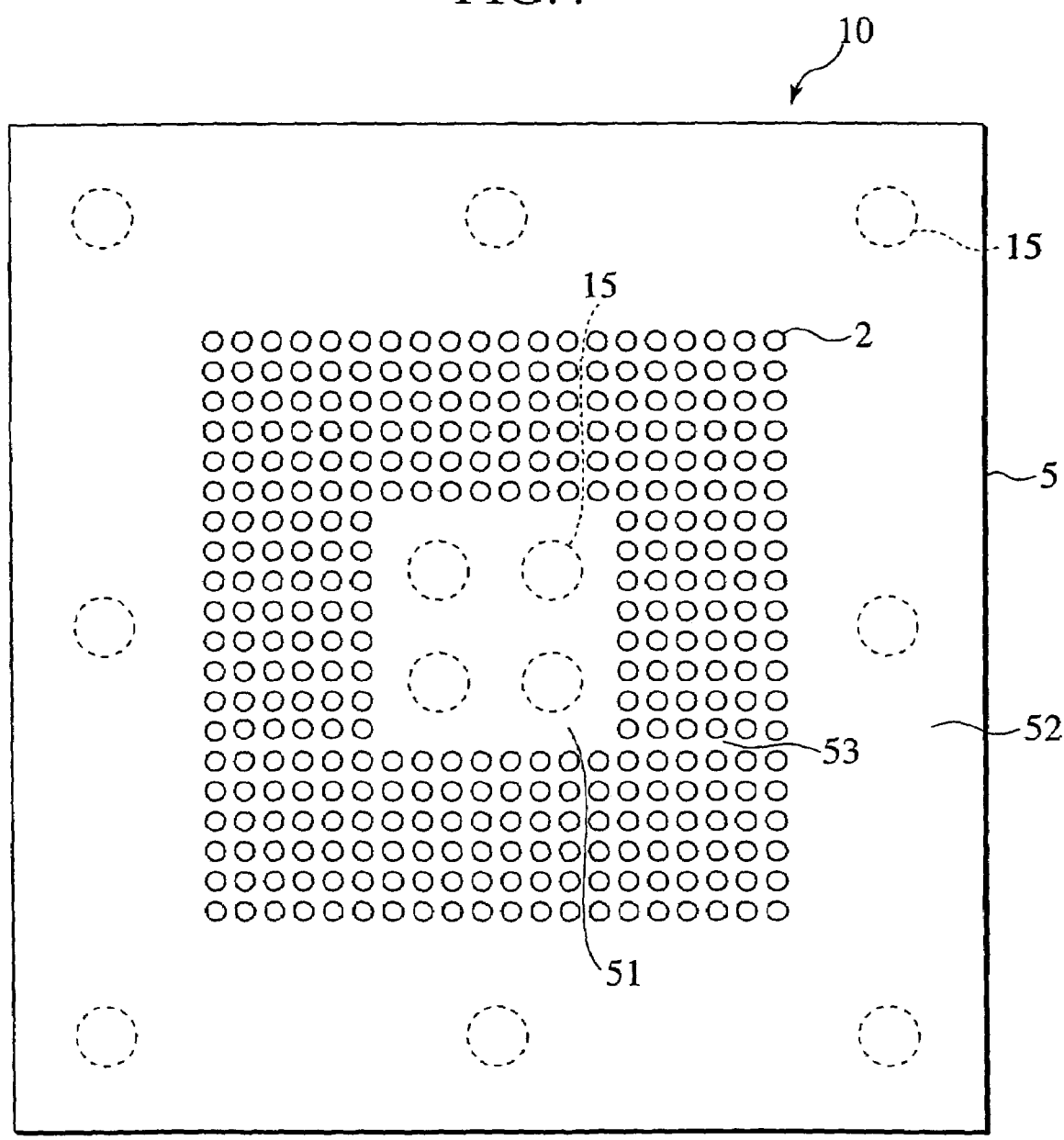
FIG. 4 is a plan view showing a contactor in accordance with an embodiment of the invention.
Figure 5:
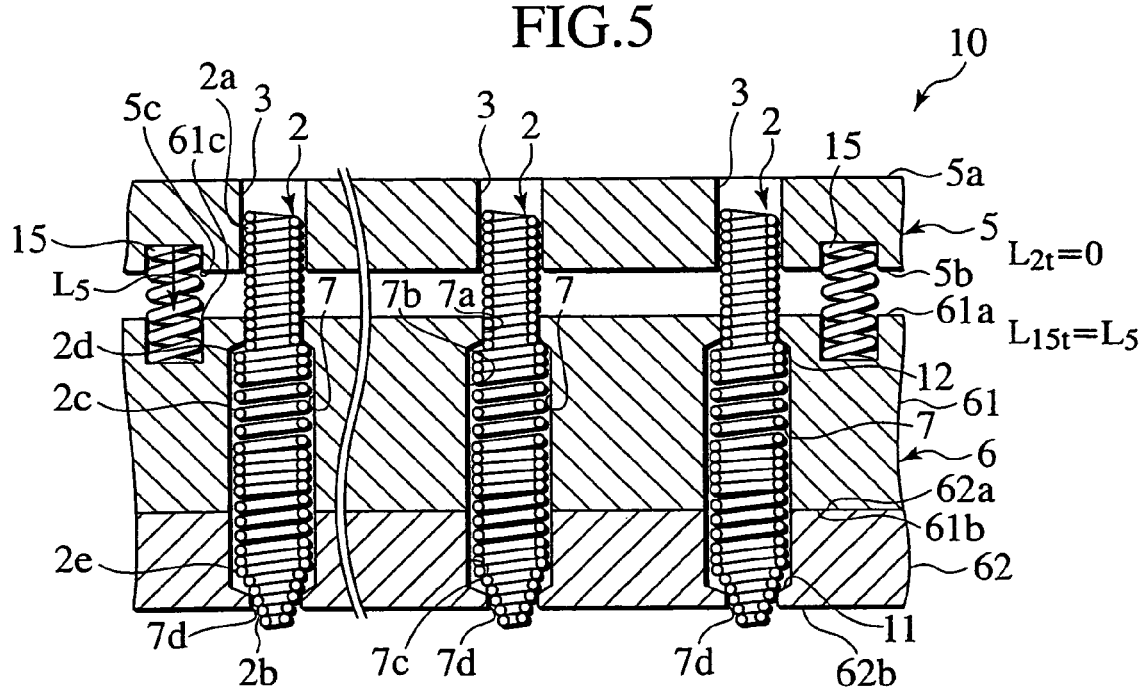
FIG. 5 is a cross sectional view showing the characterized structure thereof.
Figure 6A:
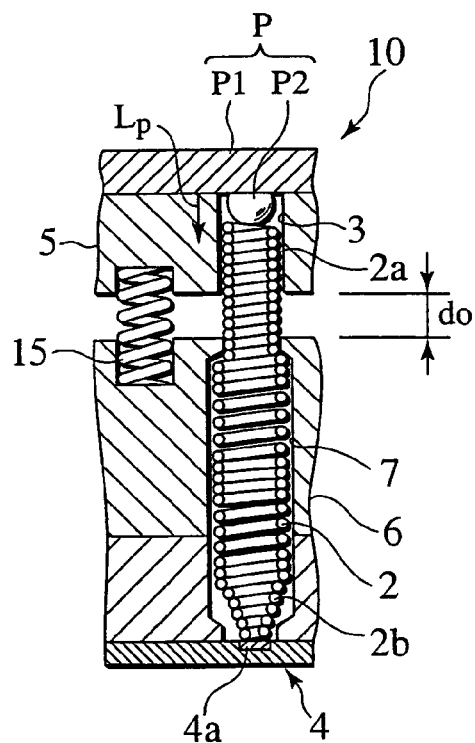
FIG. 6A is a cross sectional view showing a semiconductor package coupled with the characterized structure.
Figure 6B:
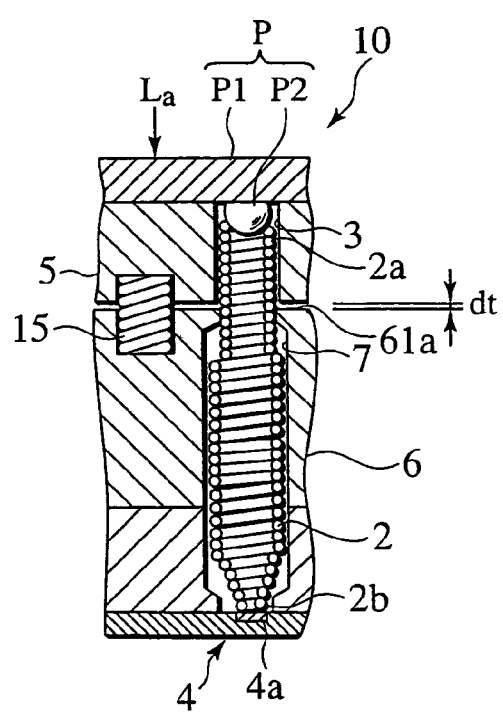
FIG. 6B is a cross sectional view showing the characterized structure during a powered test.

FIG. 4 is a plan view showing a vertical contactor 10 in accordance with the embodiment of the invention; FIG. 5 a cross sectional view showing the characterized structure thereof; FIGS. 6A and 6B a view showing the operation during a powered test.

The contactor 10 comprises a multitude of contact springs 2, a holder 6 for supporting the lower portions of these springs 2 and positioning them relative to the wiring plate 4, a guide plate 5 for guiding the neck portions 2a of the springs 2 and centering them relative to the semiconductor package P, and support springs 15 for supporting this guide plate relative to the holder. The support springs 15 are arranged in the center region 51 and the peripheral region 52 of the guide plate 5 as shown in FIG. 4 in which is illustrated an intermediate region 53 in the form of a □ where the contact springs 2 are arranged in the form of a matrix.

The contactor 10 is formed with guide holes 3 for accommodating the contacts P2 of the substrate P1 of the semiconductor package P and provided with the contact springs 2 assembled with neck portions 2a located to come in contact with the contacts P2 inserted and into the guide holes 3 and leg portion 2b being in contact and electrically connected with the conductor members 4a of the wiring plate 4.

While the contacts P2 of this embodiment are formed as a ball grid array, they can be formed as a land grid array instead.

The contact spring 2 comprises a body portion 2c including at least partially a pitch helical portion, a neck portion 2a and a leg portion 2b which are tightly twisted and continuously formed from the both ends of this body portion 2c to have smaller diameters than that of the body portion 2c. The configuration of the contact spring 2 is the same as of the contactor 100, except that the neck portion 2a is longer. Accordingly, the contact spring 2 is formed with a shoulder portion 2d between the body portion 2c and the neck portion 2a and a seat portion 2e between the body portion 2c and the leg portion 2b. The body portion 2c of the contact spring 2 is accommodated and retractably supported in the support hole 7 of the holder 6 in order not to come off therefrom. The neck portion 2a and the leg portion 2b are arranged to project out from the holder 6.

The holder 6 is composed of an upper holder 61 and a lower holder 62 which are joined to each other. The wiring plate 4 is placed on the bottom surface 62b of the lower holder 62. The guide plate 5 is arranged in order to move close to and apart from the upper surface 61a of the upper holder 61, and provided with an upper surface 5a on which the substrate P1 is placed.

The upper holder 61 is formed with through holes 7a opened in its upper surface 61a with a small diameter, and support holes 7b communicating with the through holes 7a and opened in its bottom surface 61b with a larger diameter than the through holes 7a. Steps 12 are formed between the support holes 7b and the through holes 7a The lower holder 62 is formed with support holes 7b opened in its upper surface 62a with the same diameter as the support holes 7b, and through holes 7d communicating with the support holes 7c and opened in its bottom surface 62b with a smaller diameter than the support holes 7c. Steps 11 are formed between the support holes 7c and the through holes 7d.

As illustrated in FIG. 5, the body portions 2c of the contact springs 2 are accommodated in the support holes 7b and the support holes 7c and supported between the upper holder 61 and the lower holder 62 with the shoulder portions 2d and the seat portions 2e engaging the steps 12 and the steps 11 respectively. In this supporting condition, the neck portion 2a and the leg portion 2b are arranged to project out respectively through the through hole 7a of the upper holder 61 and the through hole 7d of the lower holder 62. The leg portion 2b can come in contact with a conductor member 4a of the wiring plate 4 placed on the bottom surface 62b of the lower holder 62 as shown in FIG. 6A.

The guide hole 3 is opened with a diameter, allowing the neck portion 2a to be inserted thereinto, through the float type guide plate 5 which is arranged in order to move close to and apart from the holder 6 retractably accommodating the contact spring 2.

The guide hole 3 is formed through the guide plate 5 in the thickness direction with a diameter slightly larger than the outer diameter of the neck portion 2a and opened in the upper surface 5a of the guide plate 5 which is a contact surface to the substrate P1 of the semiconductor package P. As shown in FIG. 5, the neck portion 2a of the contact spring 2 is slidably inserted into the guide hole 3.

The guide plate 5 is urged by the support springs 15 in the backward direction relative to the holder 6

The support springs 15 are arranged between the holder 6 and the guide plate 5 as shown in FIG. 5. For the guide plate 5 provided with several tens to several thousands of the contact springs 2, for example, a couple to several tens of the support springs 15 are provided. The support springs 15 are installed by inserting the opposite ends thereof respectively into the recesses 5c opened in the bottom surface 5b of the guide plate 5 and the recesses 61c opened in the upper surface 61a of the upper holder 61. In this case, L2t (total load on each spring 2)=0 and L15t (total load on each spring 15)=L5.

The semiconductor package P can be set on the contactor 10 by inserting the contact P2 into the guide hole 3 and bringing the substrate P1 in surface contact with the upper surface 5a of the guide plate 5 (refer to FIG. 6A, d=d$_0$, L2t=0 and L15t=L5+Lp). The semiconductor package P is then pressed down together with the guide plate 5 against the resilient force of the support springs 15 to generate an appropriate contact pressure between the contact P2 and the neck portion 2a of the contact spring 2 followed by conducting a powered test (refer to FIG. 6B, d=dt, L2t=La·k, L15t=L5+Lp+La (1−k), where k is an adjustable coefficient smaller than 1). After the powered test, the guide plate 5 returns to the initial position by the resilient force of the support springs 15, when the external force is removed, allowing the semiconductor package P to be separated from the contactor 10.

The contact spring 2 has its body portion 2c retractably inserted in the holder 6 and its neck portion 2a projecting out from the holder 6 and slidably inserted into the guide hole 3 of the guide plate 5. The guide plate 5 is then assembled free from the load of the contact springs 2.

With the contactor 10, it is possible to stabilize the operation of the guide plate 5 regardless of the number of the contact springs 2, prevent the guide plate 5 from warping due to the loads of the contact springs 2 and improve the endurance, the degree of contact with for example solder balls and the accuracy of test.

The guide hole 3 is sized to slidably accept therein the neck portion 2a of the contact spring 2 tightly twisted in the form of a cylinder and easily accept the contact P2 of the substrate P1 of the semiconductor package P. In the case where the contacts P2 of the substrate P1 of the semiconductor package P are formed as a ball grid array, the sizes of balls are not uniform within the range of dispersion. The invention can be used to deal with the dispersion to improve the accuracy of test. The contact P2, having a size larger or smaller than the outer diameter of the neck portion 2a of the contact spring 2, can be aligned by inserting it into the guide hole 3.

Since the contactor 10 is provided with the support springs 15 for supporting the guide plate 5 separate from the contact springs 2, the force of pushing up the guide plate 5 can be adjusted without compromising the electrical characteristics by suitably selecting the resilient force of the support springs 15 to realize stable operation.

The distance d (refer to FIG. 2) between the guide plate 5 and the holder 6 can be determined by suitably selecting the length of the support springs 15 and the winding number of the neck portion 2a of the contact spring 2 without any modification of the thickness of the guide plate 5 and the structure of the contact spring 2. The electrical characteristics are adjusted also only with minimum modification, i.e., with modification of the neck portion 2a but without any modification of the body portion 2c of the contact spring 2.

It is possible to set the upper surface 5a of the guide plate 5 at a height which is selected to decrease the drop of the semiconductor package P during the test, minimize the shock of the semiconductor package P when dropping without any modification of a conventional transportation device of the semiconductor package P, insert the contact P2 into the guide hole 3 with a high degree of accuracy, and improve the stabilization of operation and the accuracy of test.

The contact spring 2 is plated with a metal lacking affinity for solder. This plating process is performed as gold/silver plating, metal plating of nickel, rhodium, iridium or the like for the purpose of preventing the contacts P2 of the semiconductor package P and the neck portions 2a of the contact springs 2 from welding together when they come into contact with each other under an excessive contact pressure (or at a high temperature). It is possible to prevent the contact P2 and the neck portion 2a from welding together during test and improve the stabilization of operation and the accuracy of test.

As explained above, in accordance with the invention recited in claim 1, the flexibility of selecting the rate of spring of the contact spring can be increased with a uniform contact resistance.

In accordance with the invention recited in claim 2, since the guide plate is assembled without application of the load of the contacts spring, it is possible to stabilize the operation of the guide plate 5 regardless of the number of the contact springs, prevent the guide plate from warping due to the loads of the contact springs and improve the endurance and the accuracy of test.

In addition to this, the guide hole is sized to slidably accept therein the neck portion of the contact spring and easily accept a larger contact of the substrate of a semiconductor package.

Also, the support springs for supporting the guide plate 5 is provided separate from the contact springs, the force of pushing up the guide plate can be arbitrarily adjusted without compromising the electrical characteristics by suitably selecting the resilient force of the support springs to realize stable operation.

Furthermore, by suitably selecting the length of the support springs and the winding number of the neck portion of the contact spring 2 without any modification of the thickness of the guide plate 5 and the structure of the contact spring 2, it is possible to set the upper surface of the guide plate at a height with which is decreased the drop of the semiconductor package P during the test, minimize the shock of the semiconductor package P when dropping without any modification of a conventional transportation device of the semiconductor package, insert the contact into the guide hole with a high degree of accuracy, and improve the stabilization of operation and the accuracy of test.

Still further, in accordance with the invention recited in claim 3, since the contact and the neck portion are prevented from welding together during test, the stabilization of operation and the accuracy of test can be furthermore improved in addition to the advantages of claim 2.

INDUSTRIAL APPLICABILITY

In accordance with the invention, it is possible to provide a contactor with a uniform contact resistance and facilitate the testing of a semiconductor package.

The invention claimed is:

1. A contactor comprising:
  a contact spring having a leg portion, a body portion and a tightly twisted neck portion adapted, for current conduction, to directly contact on an electrical contact of a device under test;
  a holder having a reception hole from which the leg portion and the neck portion may project and the body portion inhibited from coming out at both ends thereof;
  a float type guide plate having a guide hole configured for the neck portion to be slidably inserted therein at one end thereof and for the electrical contact of the device to be fitted therein at the other end thereof; and
  a support spring interposed between the holder and the guide plate, supporting the guide plate free from a spring load of the contact spring,
  wherein the holder bears a spring load of the contact spring, and the holder and the guide plate bear a spring load of the support spring so that the support spring provides a biasing pressure to the guide plate, thereby controlling force applied to the device under test by the guide plate contacting therewith, at different biasing pressures from a biasing pressures applied by the neck portion of the contact spring directly contacting on the electrical contact of the device.

2. The contactor as claimed in claim 1, wherein the contact spring enables a non-rigid contact function to allow employment of multiple contacts.

3. A contactor comprising:
  a guide hole for receiving an electrical a contact of a substrate of a semiconductor package; and a contact spring assembled with
- a neck portion located to come in contact with the electrical contact inserted into the guide hole; and
- a leg portion to be electrically connected to a conductor member of a wiring plate, wherein the guide hole is opened, with a diameter allowing insertion of the neck portion, through a guide plate arranged in order to move close to and apart from a holder retractably accommodating the contact spring, the neck portion being tightly twisted, projecting out from the holder, and slidably inserted into the guide hole, the holder preventing a body portion of the contact spring from coming out at both ends thereof, wherein a support spring urges the guide plate in a backward direction relative to the holder, and the guide plate configured to be free from a spring load of the contact spring, and wherein the holder bears a spring load of the contact spring, and the holder and the guide plate bear a spring load of the support spring so that the support spring provides a biasing pressure to the guide plate, thereby controlling force applied to the semiconductor package under test by the guide plate contacting therewith, at different biasing pressures from a biasing pressures applied by the neck portion of the contact spring directly contacting on the electrical contact of the substrate of the semiconductor package.

4. The contactor as claimed in claim 3, wherein the contact spring is plated with a metal lacking affinity for solder.

5. The contactor as claimed in claim 3, wherein the contact spring enables a non-rigid contact function to allow employment of multiple contacts.

6. A contactor comprising:
- a contact spring having a leg portion, a body portion and a tightly twisted neck portion adapted, for current conduction, to directly contact on an electrical contact of a device under test;
- a reception hole having a form allowing the leg portion and the neck portion to project out while inhibiting the body portion from coming out at both ends thereof;
- a holder having the reception hole formed therein;
- a float type guide plate having a guide hole configured for the neck portion to be slidably inserted therein at one end thereof and for the electrical contact of the device to be fitted therein at the other end thereof; and
- a support spring interposed between the holder and the guide plate, wherein the holder bears a spring load of the contact spring, and the holder and the guide plate bear a spring load of the support spring so that the support spring provides a biasing pressure to the guide plate, thereby controlling force applied to a device under test by the guide plate contacting therewith, at different biasing pressures from a biasing pressures applied by the neck portion of the contact spring directly contacting on the electrical contact of the device.

7. The contactor as claimed in claim 6, wherein the holder comprises a plurality of members joined together.

8. The contactor as claimed in claim 6, wherein the contact spring enables a non-rigid contact function to allow employment of multiple contacts.

9. A contactor comprising:
- a guide hole for receiving an electrical a contact of a substrate of a semiconductor package; and
- a reception hole for receiving a contact spring assembled with
  - a neck portion located to come in contact with the electrical contact inserted into the guide hole, and
  - a leg portion to be electrically connected to a conductor member of a wiring plate, wherein the guide hole is opened, with a diameter allowing insertion of the neck portion, through a guide plate arranged in order to move relative to a holder retractably accommodating the contact spring, the neck portion being tightly twisted, projecting out from the holder, and slidably inserted into the guide hole, with the guide plate urged by a support spring in a backward direction relative to the holder, wherein the reception hole has a form from which the leg portion and the neck portion are allowed to project out, inhibiting a body portion from coming out at both ends thereof, and wherein the holder bears a spring load of the contact spring, and the holder and the guide plate bear a spring load of the support spring so that the support spring provides a biasing pressure to the guide plate, thereby controlling force applied to the semiconductor package under test by the guide plate contacting therewith, at different biasing pressures from a biasing pressures applied by the neck portion of the contact spring directly contacting on the electrical contact of the substrate of the semiconductor package.

10. The contactor as claimed in claim 9, wherein the holder comprises a plurality of members joined together.

11. The contactor as claimed in claim 9, wherein the contact spring is plated with a metal lacking affinity for solder.

12. The contactor as claimed in claim 9, wherein the contact spring enables a non-rigid contact function to allow employment of multiple contacts.

* * * * *